(12) United States Patent
Li et al.

(10) Patent No.: US 8,781,639 B2
(45) Date of Patent: Jul. 15, 2014

(54) DIGITAL WIRELESS NETWORK RECEPTACLE

(76) Inventors: Max Li, Dana Point, CA (US); Roy Ting, New Taipei (TW)

(*) Notice: Subject to any disclaimer, the term of this patent is extended or adjusted under 35 U.S.C. 154(b) by 391 days.

(21) Appl. No.: 13/349,237

(22) Filed: Jan. 12, 2012

(65) Prior Publication Data
US 2013/0184890 A1 Jul. 18, 2013

(51) Int. Cl.
| | | |
|---|---|---|
| *G01R 21/00* | (2006.01) | |
| *G01R 21/06* | (2006.01) | |
| *G05D 3/12* | (2006.01) | |
| *G06F 1/00* | (2006.01) | |
| *G06F 1/26* | (2006.01) | |
| *G06F 1/32* | (2006.01) | |
| *G08B 23/00* | (2006.01) | |
| *H01H 85/46* | (2006.01) | |
| *H02H 3/00* | (2006.01) | |
| *H02H 3/04* | (2006.01) | |
| *H02J 3/00* | (2006.01) | |
| *H02J 3/14* | (2006.01) | |
| *H02J 13/00* | (2006.01) | |
| *H02H 3/40* | (2006.01) | |
| *G01R 21/133* | (2006.01) | |
| *H01H 71/00* | (2006.01) | |
| *H02M 1/00* | (2006.01) | |

(52) U.S. Cl.
CPC ............... *H02H 3/00* (2013.01); *G01R 21/133* (2013.01); *G06F 1/3203* (2013.01); *G06F 1/3287* (2013.01); *H01H 2071/006* (2013.01); *H01H 2071/008* (2013.01); *H02H 3/006* (2013.01); *H02H 3/40* (2013.01); *H02J 3/00* (2013.01); *H02J 13/0075* (2013.01); *H02J 13/0086* (2013.01); *H02J 3/14* (2013.01); *H02M 2001/0009* (2013.01)

USPC .......... 700/293; 700/286; 700/292; 700/295; 307/31; 307/35; 340/693.1; 702/60; 713/310; 713/320

(58) Field of Classification Search
CPC ...... G06F 1/3287; H02H 3/00; H02H 3/3006; H02H 3/40; H02J 3/00; H02J 13/0086; H02J 13/0075; H02J 3/14; H02M 2001/009
USPC .............. 700/286, 292, 293, 295; 307/31, 35; 340/693.1; 702/60; 713/310, 320
See application file for complete search history.

(56) References Cited

U.S. PATENT DOCUMENTS

| | | | |
|---|---|---|---|
| 2004/0267385 A1* | 12/2004 | Lingemann | 700/83 |
| 2005/0060107 A1* | 3/2005 | Rodenberg et al. | 702/62 |
| 2009/0150509 A1* | 6/2009 | Chang et al. | 709/208 |
| 2010/0045232 A1* | 2/2010 | Chen et al. | 320/109 |
| 2011/0307101 A1* | 12/2011 | Imes et al. | 700/276 |
| 2012/0166008 A1* | 6/2012 | Jeong | 700/295 |
| 2012/0262153 A1* | 10/2012 | Yang et al. | 324/142 |
| 2014/0067143 A1* | 3/2014 | Chen et al. | 700/291 |

* cited by examiner

*Primary Examiner* — Mohammad Ali
*Assistant Examiner* — Jennifer L Norton

(57) ABSTRACT

A digital wireless network receptacle has an upper housing, two power sockets formed through the upper housing, a lower housing and a multi-layer mechanism mounted between the upper housing and the lower housing. A single microcontroller unit (MCU) is employed within the multi-layer mechanism so that an intelligent control circuit can be effectively integrated and received in the receptacle with standardized size and limited space. Each power socket of the receptacle is independently monitored and controlled, and power consumed from each power socket can be recorded to ensure a complete understanding of power usage. Besides transmission of power consumption information to a host server through a wireless network, automatic power breaking safety protection upon an overload or standby condition of electrical appliances can be provided.

6 Claims, 5 Drawing Sheets

DIGITAL WIRELESS NETWORK RECEPTACLE

FIELD OF THE INVENTION

The present invention relates to a digital wireless network receptacle and more particularly to a digital wireless network receptacle having a single microcontroller unit (MCU) mounted therein to independently monitor each power socket of the receptacle, measure power consumed from each power socket, collect power consumption information through a wireless network, and provide automatic power breaking safety protection upon an overload or standby condition of electrical appliances.

BACKGROUND OF THE INVENTION

In view of the increasingly aggravated energy shortage crisis, energy conservation and environmental protection issues are reaching a global consensus. According to studies, ten percent of regular household power usage is wasted, mostly occurring when corresponding electrical appliances are in a standby state instead of an operating state.

Fortunately, newly developed intelligent chip modules can be built in home electrical appliances to significantly lower power consumed upon the standby state of the electrical appliances, and may be designed as intelligent receptacle to monitor irregular power consumption of electrical appliances, thereby digitally managing household power consumption to alleviate the tremendous unnecessary wasting of energy and provide power-saving effects. Moreover, when electrical appliances consume power abnormally, the intelligent receptacle can automatically cut off power, rendering more flexible and safer use of household power.

Currently, due to the limited mounting space on the wall, outer cases of conventional digital wireless network intelligent receptacles are fixed in size and an inner space of the conventional receptacles is almost fully utilized. Further, conventional intelligent chip modules in the market are also fixed in size. If two intelligent chip modules are simultaneously mounted in a receptacle, the receptacle has insufficient space to accommodate the overall size of the intelligent chip modules, let alone related metal pins necessarily mounted inside the receptacle. Despite the availability of two power sockets, each regular digital wireless network intelligent receptacle actually has only one power socket monitored by an MCU to keep track of power consumption by an electrical appliance plugged into the socket.

Since each digital wireless network intelligent receptacle has only one power socket monitored and controlled, if users do not pay too much attention and randomly plug an electrical appliance in one of the two power sockets, the electrical appliance may have half a chance of failing to be monitored and the still existing continuous power wastage problem leads to incomplete power management. In consideration of the power wasted by each family, the accumulated power wasted by a numerous families in a community should be staggering. Such an outcome surely leads to a failure of achieving a city-wide and a nation-wide power management policy.

SUMMARY OF THE INVENTION

An objective of the present invention is to provide a digital wireless network receptacle having a single microcontroller unit (MCU) mounted therein to independently monitor each socket of the receptacle, record power consumption, collect power consumption information through a wireless network, and provide automatic power breaking safety protection upon an overload or standby condition of an electrical appliance.

To achieve the foregoing objective, an embodiment digital wireless network receptacle has an upper housing, two power sockets, a lower housing and a multi-layer mechanism.

The two power sockets are formed through the upper housing. Each power socket has two inner terminals.

The multi-layer mechanism is mounted between the upper housing and the lower housing and has a top platform, a middle layer and a bottom plate. The top platform has at least one reset button and two lugs. The at least one reset button is mounted centrally on the top platform. The two lugs are respectively formed on and protrude from two ends of the top platform and extend beyond the upper housing and the lower housing.

The middle layer has four tabs, four partitions and four metal conductors. The four metal conductors take a crooked form and are received in the respective partitions and held by the respective tabs. Each adjacent pair of the metal conductors form the inner terminals of one of the power sockets.

The bottom plate has an intelligent control circuit mounted thereon.

Each metal conductor has a contact end formed through a wall of the partition and extending downwardly to connect with the intelligent control circuit so that the intelligent control circuit is controlled and initialized by the one of two reset buttons.

A circuit loop connected to the inner terminals of each power socket is serially connected with a protection resistor and a control switch.

The intelligent control circuit has a power supply unit, a measuring unit, an MCU and a network unit.

The power supply unit converts an AC input power into a DC power to supply an operating power to the intelligent control circuit.

The measuring unit is connected to the circuit loops respectively connected to the inner terminals of the power sockets to independently measure power consumed through the respective power sockets.

The MCU is connected to the measuring unit and the two control switches to independently control power supplied from the power sockets.

The network unit is connected to the MCU and is adapted to wirelessly exchange data with an external wireless receiving device based on a standard wireless network communication protocol.

The intelligent control circuit having a single MCU is integrated and received in the digital wireless network receptacle so that each power socket is independently monitored and controlled, power consumed through each power socket is recorded and information related thereto is collected through a wireless network, and provides automatic power breaking safety protection capabilities upon an overload or standby condition of an electrical appliance.

As the single MCU is employed within the multi-layer mechanism, the intelligent control circuit can be effectively integrated and received in the receptacle with a standardized size and limited space. Each of the power sockets of the receptacle can be independently monitored and controlled, and power consumed from each of the power sockets can be recorded to ensure a complete understanding of power usage. Besides transmission of power consumption information to a host server through a wireless network, automatic power breaking safety protection upon an overload or standby condition of an electrical appliance can be provided.

The foregoing and other features and advantages of the present invention will be more clearly understood through the following descriptions with reference to the drawing, wherein:

DETAILED DESCRIPTION OF THE PREFERRED EMBODIMENT

It is to be noted that the following descriptions of preferred embodiments of this invention are presented herein for purpose of illustration and description only; it is not intended to be exhaustive or to be limited to the precise form disclosed.

Figure 1:
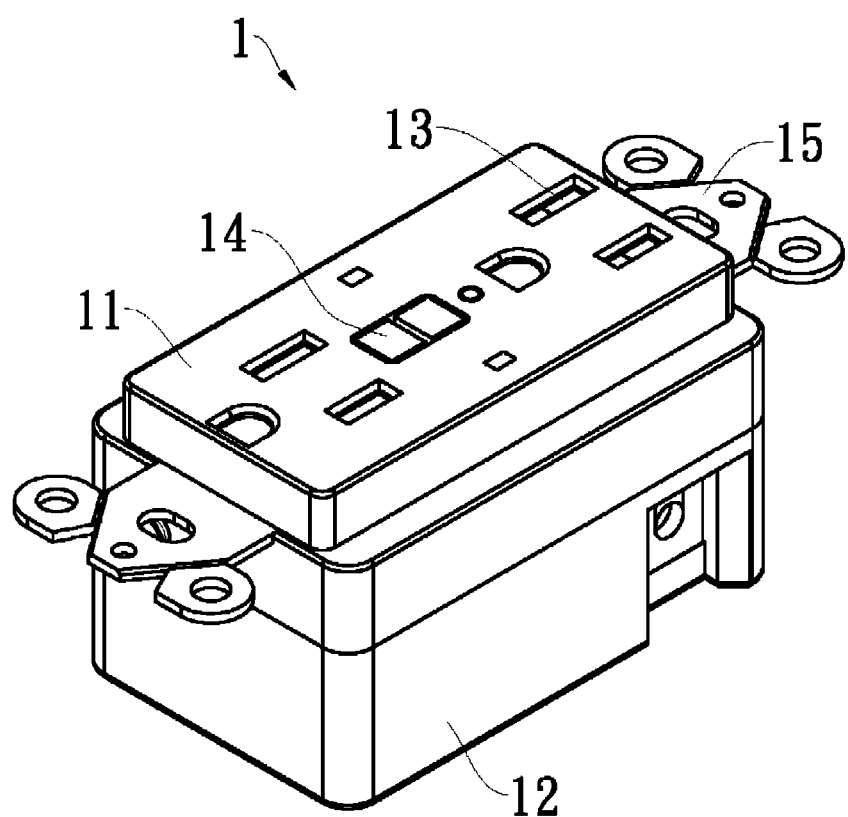
FIG. 1 is a perspective view of a digital wireless network receptacle in accordance with an embodiment of the present invention.
Figure 2:
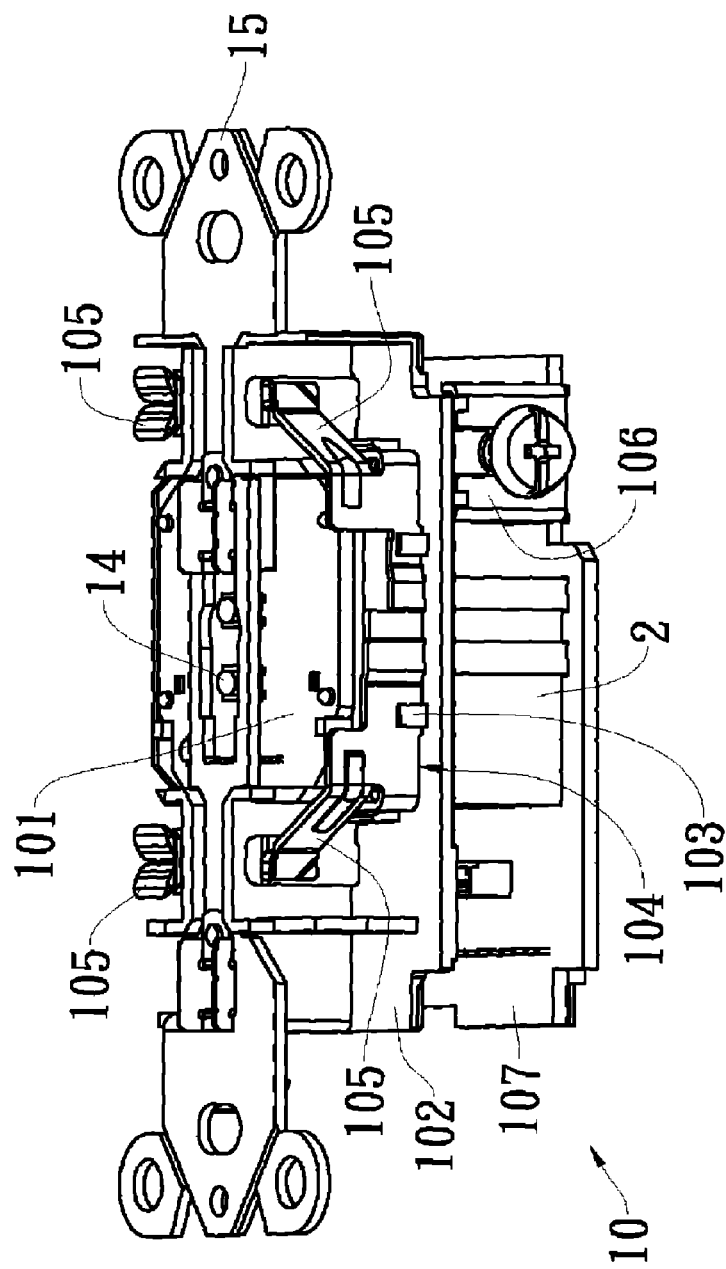
FIG. 2 is an enlarged perspective view of a multi-layer mechanism mounted inside the digital wireless network receptacle in FIG. 1.
Figure 3:
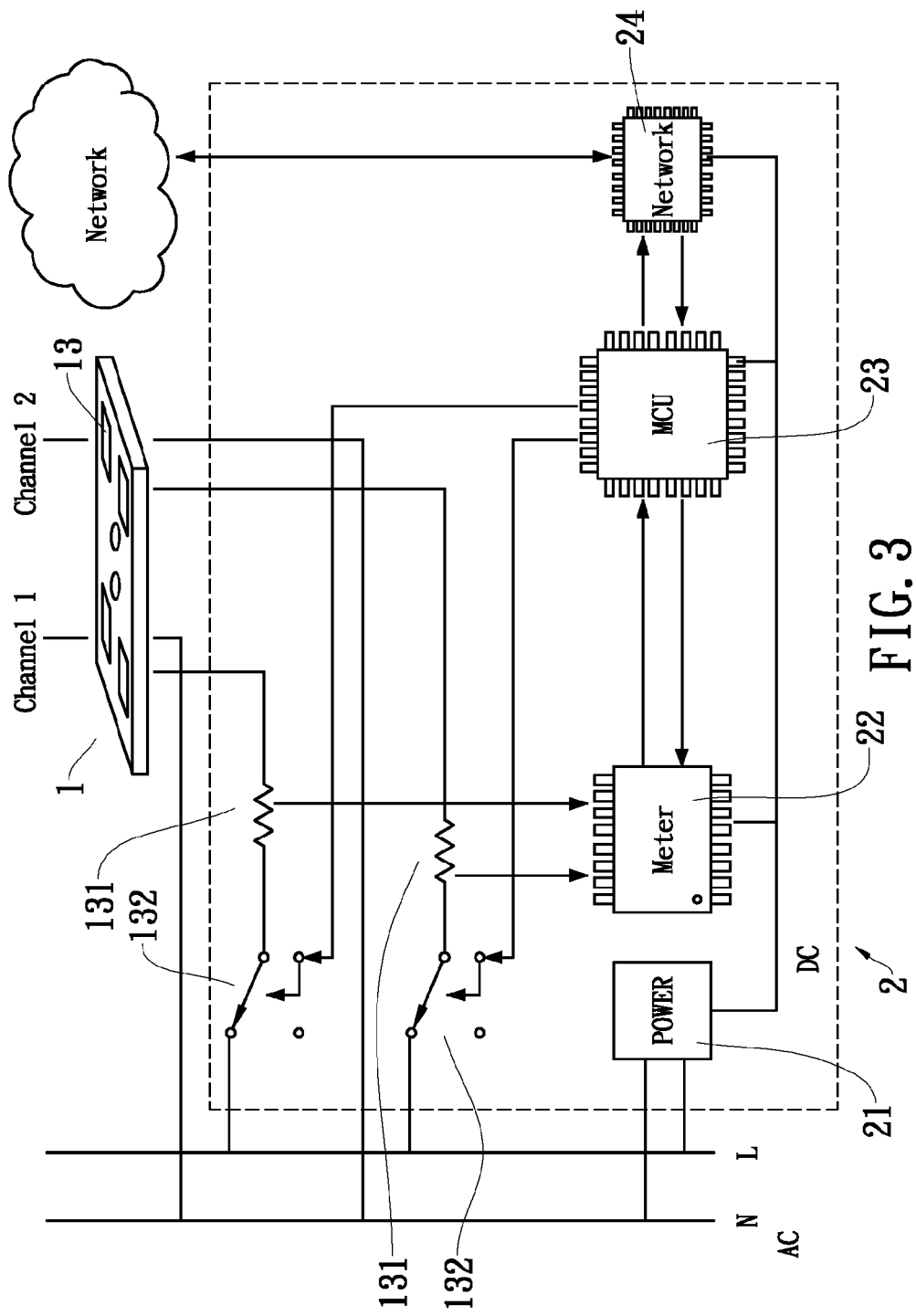
FIG. 3 is a schematic view of a circuit of the digital wireless network receptacle in FIG. 1.

The structure and applications of the present invention will now be described more specifically with reference to the following embodiments. With reference to FIGS. 1 to 3, a digital wireless network receptacle (DWNR) 1 in accordance with the present invention has an upper housing 11, two power sockets 13, a lower housing 12 and a multi-layer mechanism 10.

The power sockets 13 are formed through the upper housing 11 and each power socket 13 has two inner terminals. The multi-layer mechanism 10 is mounted between the upper housing 11 and the lower housing 12 and has a top platform 101, a middle layer 102 and a bottom plate 107. The top platform 101 has at least one reset buttons 14 and two lugs 15. In the present embodiment, the top platform 101 has two reset buttons 14. The two reset buttons 14 are mounted centrally on the top platform 101. The lugs 15 are respectively formed on and protrude from two ends of the top platform 101 and extend beyond the upper housing 11 and the lower housing 12. The middle layer 102 has multiple tabs 103, four partitions 104 and four metal conductors 105. The four metal conductors 105 are crooked and are received in the respective partitions 104 and held by the respective tabs 104. Each adjacent pair of the metal conductors 105 form inner terminals of one of the power sockets 13. The bottom plate 107 has an intelligent control circuit 2 mounted thereon. Each metal conductor 105 has a contact end 106 formed through a wall of the partition and extending downwardly to connect with the intelligent control circuit 2 so that the intelligent control circuit can be controlled and initialized by the one of two reset buttons 14.

A circuit loop connected to the inner terminals of each power socket 13 is serially connected with a protection resistor 131 and a control switch 132. The intelligent control circuit 2 has a power supply unit 21, a measuring unit 22, an MCU 23 and a network unit 24.

The power supply unit 21 converts an AC input power into a DC power to supply an operating power to all components of the intelligent control circuit 2.

The measuring unit 22 is connected to the circuit loops respectively connected to the inner terminals of the power sockets 13 to independently measure power consumed through the respective power sockets 13.

The MCU 23 is connected to the measuring unit 22 and the two control switches 132 to independently control power normally supplied from the power sockets 13.

The network unit 24 is connected to the MCU and wirelessly exchanges data with an external wireless receiving device based on a standard wireless network communication protocol.

As the DWNR 1 only employs a single MCU 23, the entire intelligent control circuit 2 can be received in the DWNR 1 having a standardized, fixed and limited space therein, so that the single MCU 23 alone can monitor each power socket 13 and record power consumed through the power sockets 13.

When the DWNR 1 is operated, the measuring unit 22 measures current information of power consumed by each power socket 13, including voltage, current and power consumption, for the MCU to collect and record the current information via a serial communication link. The network unit 24 serves to exchange data with multiple external wireless network end devices through a wireless network. The MCU 23 sends an ON/OFF control signal to power on or off each power socket 13.

The DWNR 1 also has two power sockets 13 being just like any conventional receptacles sold on the market. Not only does the DWNR 1 support wall mounting to regular buildings and independent measurement of power consumed through each power socket on the DWNR 1 but also supports an independent remote control design and private password setting for users to self-define levels of management priorities or set up an effective range for network connection according to a space planning.

Figure 4:
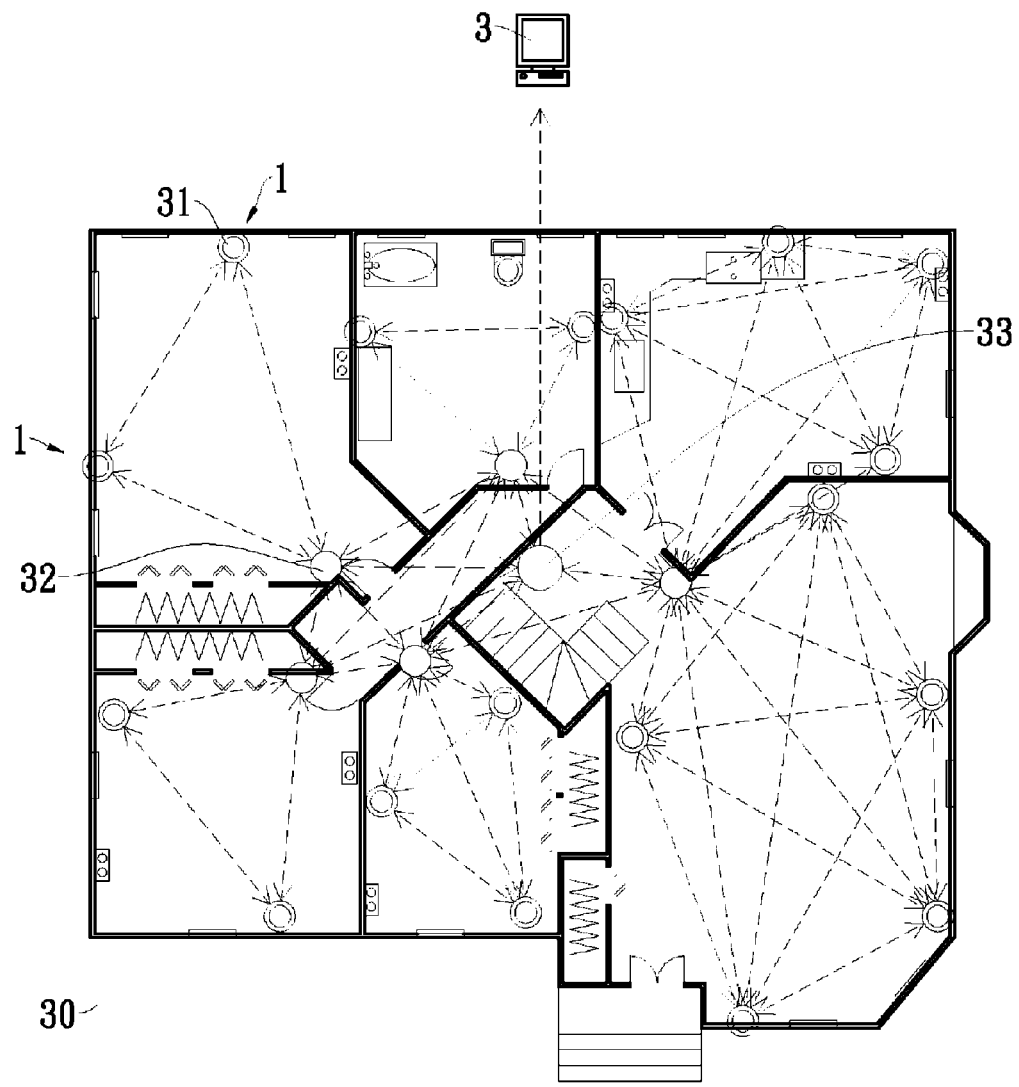
FIG. 4 is a schematic view of a hardware system constituting a household energy management server in accordance with an embodiment of the present invention.
Figure 5:
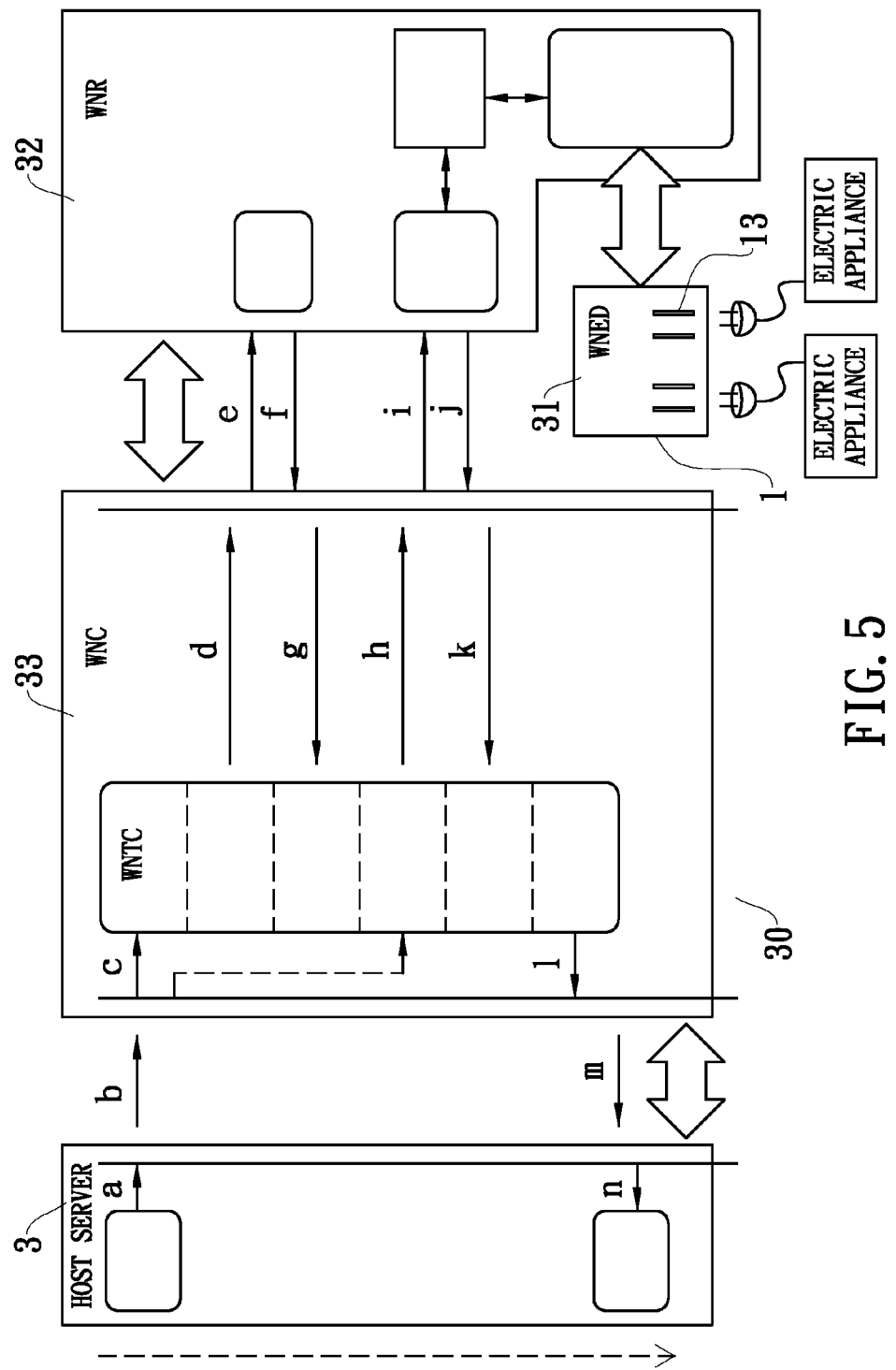
FIG. 5 is a data flow diagram of the household energy management server in FIG. 4.

With reference to FIGS. 4 and 5, when operated, all Wireless Network End Device (WNED) 31 (marked by rings in FIG. 4 and equivalent to the foregoing DWNRs 1) distributed within a power supply zone establish a wireless network. The wireless network is further collaborated with a host server 3 deployed at an optimal position within the power supply zone ideal for wireless communication with all the WNEDs 31 to support remote control over and monitoring of each WNED 31 and remote power consumption information acquisition from each WNED 31 and to function as a household energy management system 30.

The household energy management system 30 further has at least one wireless network router (WNR) 32 (marked by a medium circle) and a wireless network coordinator (WNC) 33 (marked by a large circle). The WNC 33 runs at the application layer and has an MCU, an agent, wireless network test client (WNTC), and has a network layer module. The WNTC is run by the MCU of the WNC 33. A power management method of the household energy management system 30 includes the following steps.

(a) The host server 3 issues a command to read power consumption of an independent power socket on one of the WNEDs 31 or a Wireless Network Router (WNR) 32 (marked by a medium circle).

(b) The host system 3 transmits the command to a wireless network coordinator (WNC) 33 (marked by a large circle) via a UART interface.

(c) The WNTC executed by the MCU of the WNC 33 accepts the command issued from the host server 3. After receiving the command issued from the host server 3, the WNTC on the WNC 33 directly fetches a network address of a destination end from a device type column of the destination end in the command.

(d) The WNTC transmits a wireless packet containing the network address of the destination end to a remote WNED 31 matching with the network address of the destination end.

(e) The network layer module of the WNTC in compliance with an energy wireless network protocol processes the command defined by the application layer and packetizes the command into a packet capable of being wirelessly transmitted in an actual energy network.

(f) After a corresponding remote WNED 31 or WNR 32 receiving the packet has the network address of the destination end designated in the packet, the remote WNED 32 or the WNR 32 sends an acknowledge (ACK) packet back to the WNC 33.

(g) The WNTC receives the ACK packet from the remote WNED 31 or the WNR 32 and identifies the network address of the destination end transmitting the ACK packet.

(h) The WNTC transmits a command for reading power consumption information to the remote WNED 31 having the network address of the destination end.

(i) After receiving the command for reading power consumption information, the remote WNED 31 detects the power consumption information of two electrical appliances, if plugged in the two power sockets, from the hardwired associated measuring unit.

(j) The remote WNED 31 transmits the power consumption information of each of the electrical appliances plugged into a corresponding power socket to the WNC 33.

(k) The WNTC acquires the power consumption information transmitted from the remote WNED 31.

(l) The host server 3 sends a request for relaying the power consumption information acquired from the remote WNED 31.

(m) The WNTC transmits the power consumption information to the host server 3 via the UART interface.

(n) The host server 3 thus receives the power consumption information transmitted from the remote WNED 31.

Given such household energy management system 30, users can clearly understand energy usage behavior thereof at any time using different power consumption profiles generated based on power usage data and decide power usage in daily life to achieve the optimized energy utilization efficiency.

As each of the two power sockets 13 of each DWNR 1 within an area can be independently monitored and controlled, an electrical appliance can be plugged in the selected power socket 13 of a corresponding DWNR 1 and the power consumption information of the electrical appliance can be detected and controlled. Accordingly, unnecessary power consumption can be effectively avoided, household power usage can be managed and city-wide and nationwide power management can be extensively and comprehensively implemented.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A digital wireless network receptacle (DWNR) comprising:
    an upper housing;
    a plurality of power sockets formed through the upper housing, each power socket having two inner terminals;
    a lower housing;
    a multi-layer mechanism mounted between the upper housing and the lower housing and having:
        a top platform having:
            at least one reset button mounted centrally on the top platform; and
            a plurality of lugs respectively formed on and protruding from two ends of the top platform and extending beyond the upper housing and the lower housing;
        a middle layer having:
            a plurality of tabs;
            a plurality of partitions; and
            a plurality of metal conductors taking a crooked form and received in respective partitions and held by respective tabs, wherein each adjacent pair of the metal conductors form the inner terminals of one of a corresponding power socket; and
        a bottom plate having:
            an intelligent control circuit mounted thereon, wherein each metal conductor has a contact end formed through a wall of a corresponding partition and extending downwardly to connect with the intelligent control circuit so that the intelligent control circuit is controlled and initialized by the at least one reset button;
    a circuit loop connected to the inner terminals of each power socket that is serially connected with a protection resistor and a control switch; and
    wherein the intelligent control circuit has:
        a power supply unit converting an AC input power into a DC power to supply an operating power to the intelligent control circuit;
        a measuring unit connected to the circuit loops respectively connected to the inner terminals of the power sockets to independently measure power consumed through respective power sockets;
        a microcontroller unit (MCU) connected to the measuring unit and a plurality of control switches to independently control power supplied from the power sockets; and
        a network unit connected to the MCU and adapted to wirelessly exchange data with an external wireless receiving device based on a standard wireless network communication protocol;
        whereby the intelligent control circuit having a single MCU is integrated and received in the DWNR so that each power socket is independently monitored and controlled, power consumed through each power socket is obtained and provided through a wireless network, and further provides an automatic power breaking safety protection upon an overload or standby condition of an electrical appliance.

2. The digital wireless network receptacle as claimed in claim 1, wherein information of power consumed through each power socket includes voltage, current and power consumption information.

3. The digital wireless network receptacle as claimed in claim 2, wherein the MCU collects the power consumption information measured from the measuring unit via a serial communication link.

4. The digital wireless network receptacle as claimed in claim 3, wherein the DWNR is configured to provide wall mounting and a private password setting for each power socket.

5. The digital wireless network receptacle as claimed in claim 4, wherein all DWNRs distributed within a power supply zone establish a wireless network, the wireless network further including a host server supporting remote control and monitoring over each DWNR and remote power consumption information acquisition from each DWNR to constitute a household energy management system.

6. The digital wireless network receptacle as claimed in claim 5, wherein a power management method of the household energy management system includes the following steps:
 (a) the host server issues a command to read power consumption information from a power socket on one of a plurality of Wireless End Devices (WNEDs) or a Wireless Network Router (WNR);
 (b) a host system transmits the command to a wireless network coordinator (WNC) via a UART interface;
 (c) a wireless network test client (WNTC) is executed by the MCU of the WNC accepts the command issued from the host server, and after receiving the command issued from the host server, the WNTC on the WNC directly fetches a network address of a destination end from a device type column of the destination end in the command;
 (d) the WNTC transmits a wireless packet containing the network address of the destination end to a remote WNED matching the network address of the destination end;
 (e) a network layer module of the WNTC in compliance with an energy wireless network protocol processes the command defined by an application layer and packetizes the command into at least a packet for wireless communication;
 (f) after a corresponding remote WNED or WNR receiving at least a packet has the network address of the destination end designated in the packet, the remote WNED or the WNR sends an acknowledge (ACK) packet back to the WNC;
 (g) the WNTC receives the ACK packet from the remote WNED or the WNR and identifies the network address of the destination end transmitting the ACK packet;
 (h) the WNTC transmits a command for reading power consumption information to the remote WNED having the network address of the destination end;
 (i) after receiving the command for reading power consumption information, the remote WNED detects the power consumption information of at least an electrical appliance, if plugged into a power socket, from the hardwired associated measuring unit;
 (j) the remote WNED transmits the power consumption information of each of the electrical appliances plugged in a corresponding power socket to the WNC;
 (k) the WNTC acquires the power consumption information transmitted from the remote WNED;
 (l) the host server sends a request for replying the power consumption information acquired from the remote WNED;
 (m) the WNTC transmits the power consumption information to the host server via the UART interface; and
 (n) the host server receives the power consumption information transmitted from the remote WNED.

* * * * *